(12) United States Patent
Geist et al.

(10) Patent No.: US 6,957,404 B2
(45) Date of Patent: Oct. 18, 2005

(54) MODEL CHECKING WITH LAYERED LOCALIZATION REDUCTION

(75) Inventors: Danny Geist, Haifa (IL); Anna Gringauze, Haifa (IL); Sharon Keidar, Yokneam (IL)

(73) Assignee: International Business Machines Corporation, Armonk, NY (US)

( * ) Notice: Subject to any disclaimer, the term of this patent is extended or adjusted under 35 U.S.C. 154(b) by 174 days.

(21) Appl. No.: 10/328,112

(22) Filed: Dec. 20, 2002

(65) Prior Publication Data

US 2004/0123254 A1 Jun. 24, 2004

(51) Int. Cl.$^7$ ............................................. G06F 17/50
(52) U.S. Cl. ...................... 716/4; 716/1; 716/2; 716/3; 716/4; 716/5; 703/14
(58) Field of Search .................... 716/2, 4; 717/124, 717/152; 703/14

(56) References Cited

U.S. PATENT DOCUMENTS

| | | | | |
|---|---|---|---|---|
| 6,484,134 | B1 | * | 11/2002 | Hoskote ....................... 703/14 |
| 6,591,400 | B1 | * | 7/2003 | Yang .............................. 716/2 |
| 6,643,827 | B1 | * | 11/2003 | Yang .............................. 716/2 |
| 6,725,431 | B1 | * | 4/2004 | Yang .............................. 716/4 |
| 2002/0144236 | A1 | * | 10/2002 | Beer et al. ................... 717/124 |
| 2003/0208732 | A1 | * | 11/2003 | Yang .............................. 716/4 |

OTHER PUBLICATIONS

Mir et al., "Modeling and verification of embedded systems using Cadence SMV", Mar. 7–10, 2000, Electrical and Computer Engineering, 2000 Canadian Conference on , vol.: 1, pp.: 179–183 vol. 1.*

Vakilotojar et al., "RTL verification of timed asynchronous and heterogeneous systems using symbolic model checking", Jan. 28–31, 1997, Design Automation Conference 1997. Proceedings of the ASP–DAC '97. Asia and South Pacific, pp.: 181–188.*

Yunja et al., "Model checking software requirement specifications using domain reduction abstraction", Oct. 6–10, 2003, Automated Software Engineering, 2003. Proceedings. 18th IEEE International Conference on , pp.: 314–317.*

Ammann et al., "Abstracting formal specifications to generate software tests via model checking", Oct. 24–29, 1999, Digital Avionics Systems Conference, 1999. Proceedings. 18th , vol.: 2, pp.: 10.A.6–1—10.A6–10 vol. 2.*

Kamhi et al., "Adaptive variable reordering for symbolic model checking", Nov. 8–12, 1998, Computer–Aided Design, 1998. ICCAD 98. Digest of Technical Papers. 1998 IEEE/ACM International Conference on , Nov. 8–12, 1998, pp.: 359–365.*

Sreemani et al., "Feasibility of model checking software requirements: a case study", Jun. 17–21, 1996, Computer Assurance, 1996. COMPASS '96, 'Systems Integrity. Software Safety. Process Security'. Proceedings of the Eleventh Annual Conference, pp.: 77–88.*

E. Clarke, O. Grumberg, S. Jha, Y. Lu, H. Veith, 'Counterexample–guided Abstraction Refinement,' In Proc. ComputerAided Verif., pp. 154–169, Jul. 2000.

E.M. Clarke, O. Grumberg and D.A.I Peled, "Model Checking", MIT Press, pp. 171–180, Dec. 1999.

* cited by examiner

*Primary Examiner*—A. M. Thompson
*Assistant Examiner*—Helen Rossoshek
(74) *Attorney, Agent, or Firm*—Steven C. Kaufman

(57) ABSTRACT

A method for verifying a property of a complete model of a system under study includes abstracting at least some of the variables from the model so as to produce an abstract model of the system. Beginning with an initial state in a state space of the abstract model, an abstract path is found through the state space of the abstract model in accordance with the transition relation to a target state defined by the property. A subset of the abstracted variables is restored to the abstract model so as to produce an intermediate model of the system, and the property on the complete model is verified based on the intermediate model.

40 Claims, 6 Drawing Sheets

MODEL CHECKING WITH LAYERED LOCALIZATION REDUCTION

FIELD OF THE INVENTION

The present invention relates generally to design automation and verification, and specifically to design verification based on symbolic model checking.

BACKGROUND OF THE INVENTION

Model checking is a method of formal verification that is gaining in popularity as a tool for use in designing complex systems, such as integrated circuits. Model checking is typically carried out automatically by a symbolic model checking program, such as SMV. Model checking methods are described generally by Clarke et al. in *Model Checking* (MIT Press, 1999), which is incorporated herein by reference.

To perform model checking of the design of a device, a user reads the definition and functional specifications of the device and then, based on this information, writes a set of properties $\{\phi\}$ (also known as a specification) that the design is expected to fulfill. The properties are written in a suitable specification language for expressing temporal logic relationships between the inputs and outputs of the device. Such languages are commonly based on Computation Tree Logic (CTL) and/or Linear Time Logic (LTL). A hardware model M (also known as an implementation) of the design, which is typically written in a hardware description language, such as VHDL or Verilog, is then tested to ascertain that the model satisfies all of the properties in the set, i.e., that $M \models \phi$, under all relevant input sequences.

Symbolic CTL model checking involves computing the transition-relation (TR) of the model, and then applying the model checking algorithm to verify a given formula. One of the most useful features of model checking is its ability, when a property $\phi$ is found to be false on M, to construct a sequence of states and transitions (known as a path, or trace) that leads to the problematic state of the design. This path is called a counterexample. It can be used by the engineer in understanding and remedying the design defect that led to the failure of the model. In many cases, however, the full TR is too big to be computed, or the model state space "explodes" before the model checker can find a counterexample or, in the alternative, verify the formula in question.

A number of solutions to this problem have been proposed, among them localization reduction, as described, for example, by Kurshan in *Computer-Aided Verification of Coordinating Processes* (Princeton University Press, 1994), pages 170–172, which is incorporated herein by reference. Localization reduction starts with an abstraction of the model under verification, i.e., with a model in which some of the variables are abstracted by eliminating them from the model or allowing them to take arbitrary values. As a result of this abstraction, the transition relation of the abstract model is more compact and easier to compute, but the behavior of the abstract model typically includes paths that do not exist in the complete model (also referred to as the concrete model). If a specification property is found to be true on the abstract model (i.e., no counterexample exists), then it is necessarily true on the complete model, as well, and no further verification of the property is needed.

When a counterexample is found on the abstract model, however, it is not certain that a counterexample exists in the complete model. To determine whether the abstract counterexample is valid, the model checker attempts to find an actual counterexample path on the complete model that corresponds to the abstract counterexample. This process is known as reconstruction of the abstract path. When the abstract path is successfully reconstructed, the counterexample is shown to be valid on the complete model, as well, and can be reported to the user as proof of failure of the property. When the abstract counterexample cannot be reconstructed on the complete model, it is considered to be spurious and is discarded. The abstract model may then be refined, typically by adding back in some of the variables that were previously abstracted, and the model checker continues to seek counterexamples on the refined abstract model. The process of reconstruction and refinement continues iteratively until the property is proven true or a valid counterexample is found.

The manner in which the abstract counterexample is reconstructed and, subsequently, the abstract model is refined following a failure of abstraction reduction is of key importance in making the localization reduction technique run efficiently. A number of authors have attempted to address the issue of abstraction reconstruction and refinement.

For example, Clarke et al. describe a method for automatic refinement of the abstract model using information obtained from erroneous counterexamples in "Counterexample-guided Abstraction Refinement," in *Proceedings of the Twelfth International Conference on Computer-Aided Verification* (CAV 2000), pages 154–169, which is incorporated herein by reference. According to this method, as described by the authors, when a counterexample is found in the abstract model, all the corresponding concrete paths (i.e., actual paths) are computed in the complete model. When no concrete path can be found, the abstract counterexample is considered to be spurious. The model checker then finds the shortest prefix of the abstract counterexample that does not correspond to an actual trace in the full model. The last abstract state in this prefix is split into less abstract states in such a way that the spurious counterexample is eliminated from the abstract model. (Note that each abstract state in the abstract model corresponds to multiple states in the concrete model.) Thus, a more refined abstraction is obtained, which is then used in seeking and reconstructing new counterexamples.

Although Clarke et al. showed their counterexample-guided refinement method to work in some cases, the reconstruction of all concrete paths corresponding to a long abstract path in a complex system can itself result in state explosion. Furthermore, determining the optimal refinement at each iteration is a NP-hard problem, and Clarke et al. use an approximate refinement technique that is admittedly sub-optimal. There is therefore a need for more efficient automatic methods of symbolic localization reduction.

SUMMARY OF THE INVENTION

Preferred embodiments of the present invention use a novel, layered approach to path reconstruction in the localization reduction process. When an abstract path is found, the model checker of the present invention adds a "layer" of variables to the abstract model, so as to construct a new abstract model of intermediate abstraction (less abstract than the original abstract model, but still with fewer variables than the complete concrete model). The model checker then attempts to reconstruct the abstract path on the intermediate, less abstract model. If reconstruction is successful, a further layer is added, and reconstruction is repeated iteratively over a sequence of intermediate models until a corresponding concrete path is found in the complete model. On the other hand, if the reconstruction fails on any intermediate model, it can be concluded that the original abstract model should be refined, without continuing to full path reconstruction. In either case, the layered reconstruction process reduces substantially the computation involved in reconstructing long paths, and thus reduces the likelihood of state space explosion.

In some preferred embodiments of the present invention, after adding a layer of variables to generate an intermediate abstract model, the model checker heuristically computes only a subset of the possible paths corresponding to the previously-reconstructed abstract path. If the model checker is unable to reconstruct the path within the restricted subset, it backtracks to the preceding (higher) level of abstraction, and then selects a new subset. In this way, the model checker is still able to search all possible paths in the abstract state space, while reducing still further the likelihood of state space explosion.

The choice of which variables to add in each layer is heuristic. In some preferred embodiments of the present invention, the initial abstract model includes the formula variables, i.e., the state variables that appear in the specification property $\phi$ that is being verified. An initial layer, or "cone," of variables that are in the support of the formula variables may be added to the abstract model. (The support of any given variable consists of those variables that directly influence the value of the given variable according to the system transition relation.) In the next layer, further variables in the support of the variables in the existing model are added, and so forth through the intermediate models until the reconstruction is complete. Both breadth-first and depth-first approaches may be taken in choosing the new variables to add in each layer.

When path reconstruction fails, and the abstract model must be refined, the variables added to the abstract model are also chosen heuristically. Preferably, the variables added in refinement are those that caused the previous path reconstruction to fail, because no values of those variables were found that were consistent with the abstract path under reconstruction. If an abstract path is then found on the refined abstract model, the variables in the support of the variables that were added in the refinement stage are preferably introduced in an early layer of the path reconstruction stage.

There is therefore provided, in accordance with a preferred embodiment of the present invention a method for verifying a property of a complete model of a system under study, the model defining states of the system based on a set of state variables and a transition relation among the states, the method including:

abstracting at least some of the variables from the model so as to produce an abstract model of the system;

beginning with an initial state in a state space of the abstract model, finding an abstract path through the state space of the abstract model in accordance with the transition relation to a target state defined by the property;

restoring a subset of the abstracted variables to the abstract model so as to produce an intermediate model of the system; and verifying the property on the complete model based on the intermediate model.

Preferably, verifying the property includes determining that the complete model satisfies the property when the abstract model satisfies the property.

Preferably, verifying the property includes performing a partial reconstruction of the abstract path on the intermediate model, and verifying the property based on the partial reconstruction. Typically, verifying the property further includes reconstructing a complete path through the state space of the complete model based on the intermediate path, wherein reconstructing the complete path includes repeating the steps of restoring the subset of the abstracted variables and performing the partial reconstruction in order to generate a sequence of intermediate models, with respective intermediate paths reconstructed on the intermediate models, until the complete path has been reconstructed.

In a preferred embodiment, performing the partial reconstruction includes identifying a point of failure in reconstructing the abstract path on the intermediate model, and modifying the abstract path responsively to the point of failure, and performing the partial reconstruction based on the modified abstract path.

In another preferred embodiment, performing the partial reconstruction includes identifying a point of failure in reconstructing the abstract path on the intermediate model, and refining the abstract model responsively to the point of failure, and repeating the steps of finding the abstract path, restoring the subset of the abstracted variables, and performing the partial reconstruction based on the refined abstract model. Preferably, identifying the point of failure includes identifying one or more of the variables having values in the intermediate model that are inconsistent with the reconstruction of the abstract path on the intermediate model, and refining the abstract model includes adding the identified variables to the abstract model. Most preferably, adding the identified variables includes providing a first binary decision diagram (BDD) to represent a set of legal states in the intermediate model, and providing a second BDD to represent a spurious state in the abstract model, and finding a difference between the first and second BDDs.

Further preferably, performing the partial reconstruction includes reconstructing an intermediate path on the intermediate model, such that the abstract path is a projection of the intermediate path on the variables of the abstract model.

Preferably, restoring the subset of the abstracted variables includes adding a layer of the abstracted variables, such that the variables in the added layer are in a support of the variables in the abstract model. In a preferred embodiment, verifying the property includes performing a partial reconstruction of the abstract path on the intermediate model, while adjusting one or more values of the variables in the added layer so that the partial reconstruction of the abstract path is consistent with the intermediate model. Preferably, adjusting the one or more values of the variables in the added layer includes at least one of adjusting the values of the variables in a first abstract state on the abstract path that is inconsistent with the intermediate model and adjusting the values of the variables in a second abstract state preceding the first abstract state on the abstract path.

Typically, adding the layer of the abstracted variables includes adding the layer in a first intermediate model, and verifying the property includes performing a partial reconstruction of the abstract path on the first intermediate model, and the method further includes repeating the steps of restoring the subset of the abstracted variables and performing the partial reconstruction so as to generate a sequence of intermediate models, beginning with the first intermediate model, such that for all the intermediate models following the first intermediate model, restoring the subset of the abstract variables includes adding a further layer of the abstracted variables, wherein the variables in the added layer are in a support of the variables in a preceding one of the intermediate models in the sequence.

Preferably, repeating the step of performing the partial reconstruction includes reconstructing respective intermediate paths on all of the intermediate models, so that for all of the intermediate models, the respective intermediate paths are projections of the intermediate paths reconstructed on the intermediate models that are later in the sequence. Further preferably, adding the further layer of the abstracted variables includes selecting a subset of the variables in the support of the variables in the preceding one of the intermediate models.

In a preferred embodiment, performing the partial reconstruction includes:

finding a first set of intermediate model states that are equivalent to a first abstract state on the abstract path;

taking a partial set of candidates from the first set;

finding a second set of the intermediate model states that can be reached by one intermediate model transition from the partial set and are equivalent to a second abstract state on the abstract path;

iteratively repeating the steps of taking the partial set and finding a further set of the intermediate model states that can be reached by one intermediate model transition from the partial set so as to find succeeding abstract states in an order according to which the abstract states appear on the abstract path;

upon determining at an iteration of the step of finding the further set that there are no equivalent intermediate model states that can reached by one transition from the set of intermediate candidates computed in a previous iteration, backtracking to the previous iteration and selecting a different partial set of the intermediate model states; and continuing to repeat the steps of taking the partial set and finding the further set and of backtracking to the previous iteration when there are no equivalent intermediate model states that can reached by one transition, until the abstract path is completely reconstructed or until backtracking all the way to the first set of intermediate model states and concluding that the abstract path cannot be reconstructed, thereby concluding that the abstract model requires refinement.

In a preferred embodiment, finding the abstract path includes finding a looped abstract path, and wherein verifying the property includes reconstructing an intermediate path on the intermediate model, such that the intermediate path includes a loop, and the abstract path is a projection of the intermediate path onto the abstract model. Typically, the looped abstract path has a given abstract path length, and reconstructing the intermediate path includes searching for the intermediate path subject to a condition that the intermediate path have an intermediate path length that is a multiple of the abstract path length.

There is also provided, in accordance with a preferred embodiment of the present invention, a method for checking a complete model of a system under study, the model defining states of the system in a state space based on a set of state variables and a transition relation among the states, the method including:

abstracting at least some of the variables from the model so as to produce an abstract model of the system;

beginning with an initial state in the state space of the abstract model, finding an abstract path through the state space of the abstract model in accordance with the transition relation to a target state;

restoring a subset of the abstracted variables to the abstract model so as to produce an intermediate model of the system;

reconstructing the abstract path on the state space of the intermediate model so as to generate an intermediate path through the state space; and reconstructing the intermediate path on the state space of the complete model so as to generate a complete path.

Preferably, reconstructing the intermediate path includes repeatedly restoring respective subsets of the abstracted variables in order to generate a sequence of intermediate models, and reconstructing respective intermediate paths on the intermediate models in the sequence, until the complete path has been generated.

There is additionally provided, in accordance with a preferred embodiment of the present invention, apparatus for verifying a property of a complete model of a system under study, the model defining states of the system based on a set of state variables and a transition relation among the states, the apparatus including a verification processor, which is arranged to abstract at least some of the variables from the model so as to produce an abstract model of the system and, beginning with an initial state in a state space of the abstract model, to find an abstract path through the state space of the abstract model in accordance with the transition relation to a target state defined by the property, the processor being further arranged to restore a subset of the abstracted variables to the abstract model so as to produce an intermediate model of the system, and to verify the property on the complete model based on the intermediate model.

There is further provided, in accordance with a preferred embodiment of the present invention, apparatus for checking a complete model of a system under study, the model defining states of the system in a state space based on a set of state variables and a transition relation among the states, the apparatus including a model processor which is arranged to abstract at least some of the variables from the model so as to produce an abstract model of the system and, beginning with an initial state in the state space of the abstract model, to find an abstract path through the state space of the abstract model in accordance with the transition relation to a target state, the processor being further arranged to restore a subset of the abstracted variables to the abstract model so as to produce an intermediate model of the system, to reconstruct the abstract path on the state space of the intermediate model so as to generate an intermediate path through the state space, and to reconstruct the intermediate path on the state space of the complete model so as to generate a complete path.

There is moreover provided, in accordance with a preferred embodiment of the present invention, a computer software product for verifying a property of a complete model of a system under study, the model defining states of the system based on a set of state variables and a transition relation among the states, the product including a computer-readable medium, in which program instructions are stored, which instructions, when read by a computer, cause the computer to abstract at least some of the variables from the model so as to produce an abstract model of the system and, beginning with an initial state in a state space of the abstract model, to find an abstract path through the state space of the abstract model in accordance with the transition relation to a target state defined by the property, the instructions further causing the computer to restore a subset of the abstracted variables to the abstract model so as to produce an intermediate model of the system, and to verify the property on the complete model based on the intermediate model.

There is furthermore provided, in accordance with a preferred embodiment of the present invention, a computer software product for checking a complete model of a system under study, the model defining states of the system in a state space based on a set of state variables and a transition relation among the states, the product including a computer-readable medium, in which program instructions are stored, which instructions, when read by a computer, cause the computer to abstract at least some of the variables from the model so as to produce an abstract model of the system and, beginning with an initial state in the state space of the abstract model, to find an abstract path through the state space of the abstract model in accordance with the transition relation to a target state, the instructions further causing the computer to restore a subset of the abstracted variables to the abstract model so as to produce an intermediate model of the system, to reconstruct the abstract path on the state space of the intermediate model so as to generate an intermediate path through the state space, and to reconstruct the intermediate path on the state space of the complete model so as to generate a complete path.

The present invention will be more fully understood from the following detailed description of the preferred embodiments thereof, taken together with the drawings in which:

DETAILED DESCRIPTION OF PREFERRED EMBODIMENTS

System and Method Overview

Figure 1:
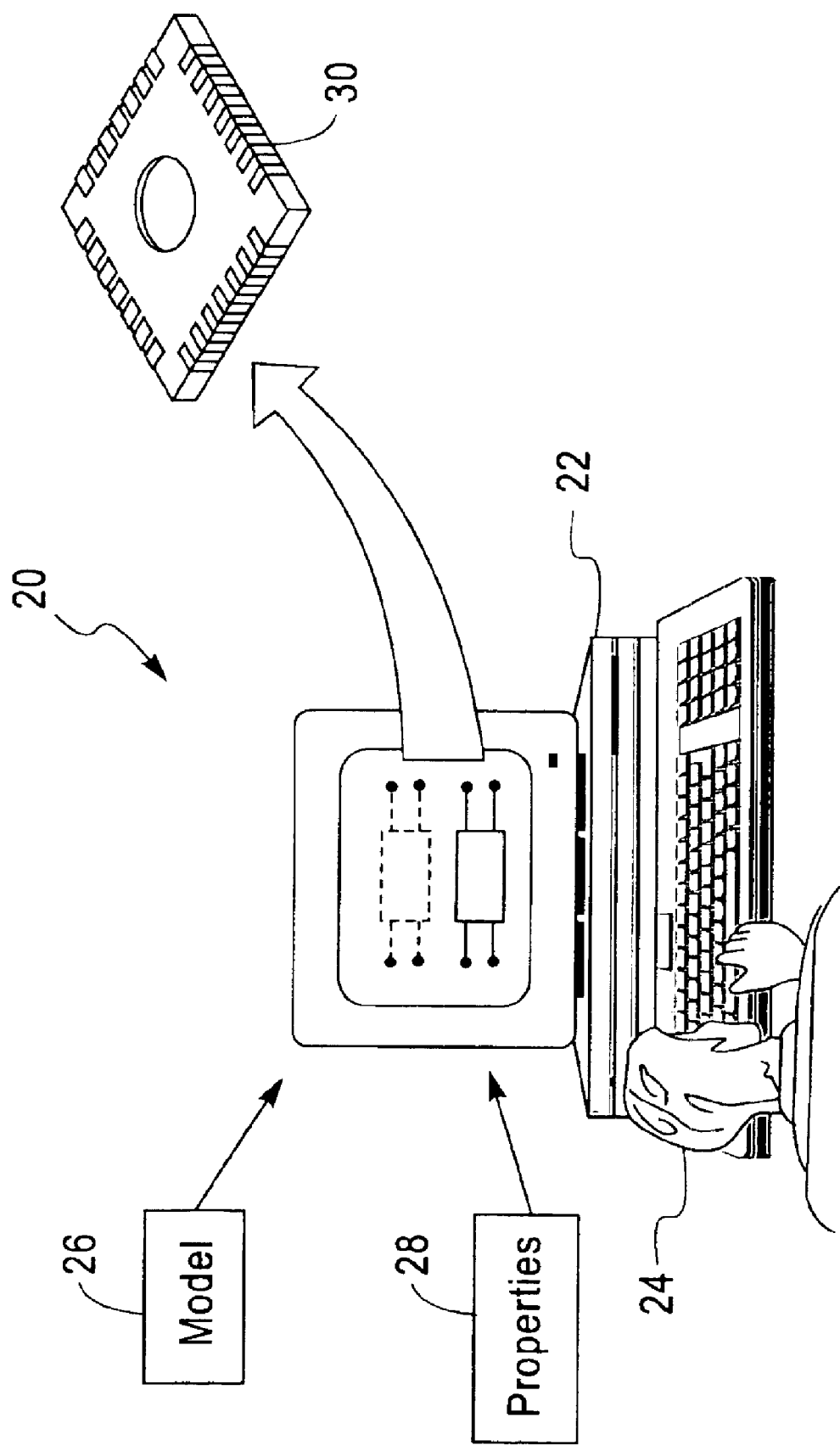
FIG. 1 is a schematic, pictorial illustration showing apparatus for design verification, in accordance with a preferred embodiment of the present invention.

FIG. 1 is a schematic pictorial illustration of apparatus 20 for symbolic model checking, in accordance with a preferred embodiment of the present invention. Apparatus 20 typically comprises a model processor 22, typically a general-purpose computer workstation running suitable model checking software. The system is operated by a user 24, typically a design or verification engineer. The model checking software may be downloaded to processor 22 in electronic form, over a network, for example, or it may be supplied on tangible media, such as CD-ROM or non-volatile memory. Processor 22 receives a hardware implementation model 26 of a target system or device 30 in development, which may refer to the entire system or device or to a sub-unit, such as a circuit or functional block. User 24 prepares a path specification 28, comprising properties for use in model checking of model 26, and selects initial states of the model. System 20 analyzes the model, using methods described in detail hereinbelow, in an attempt to find traces between the initial states and target states, which are inferred by processor 22 based on the path specification.

Figure 2:
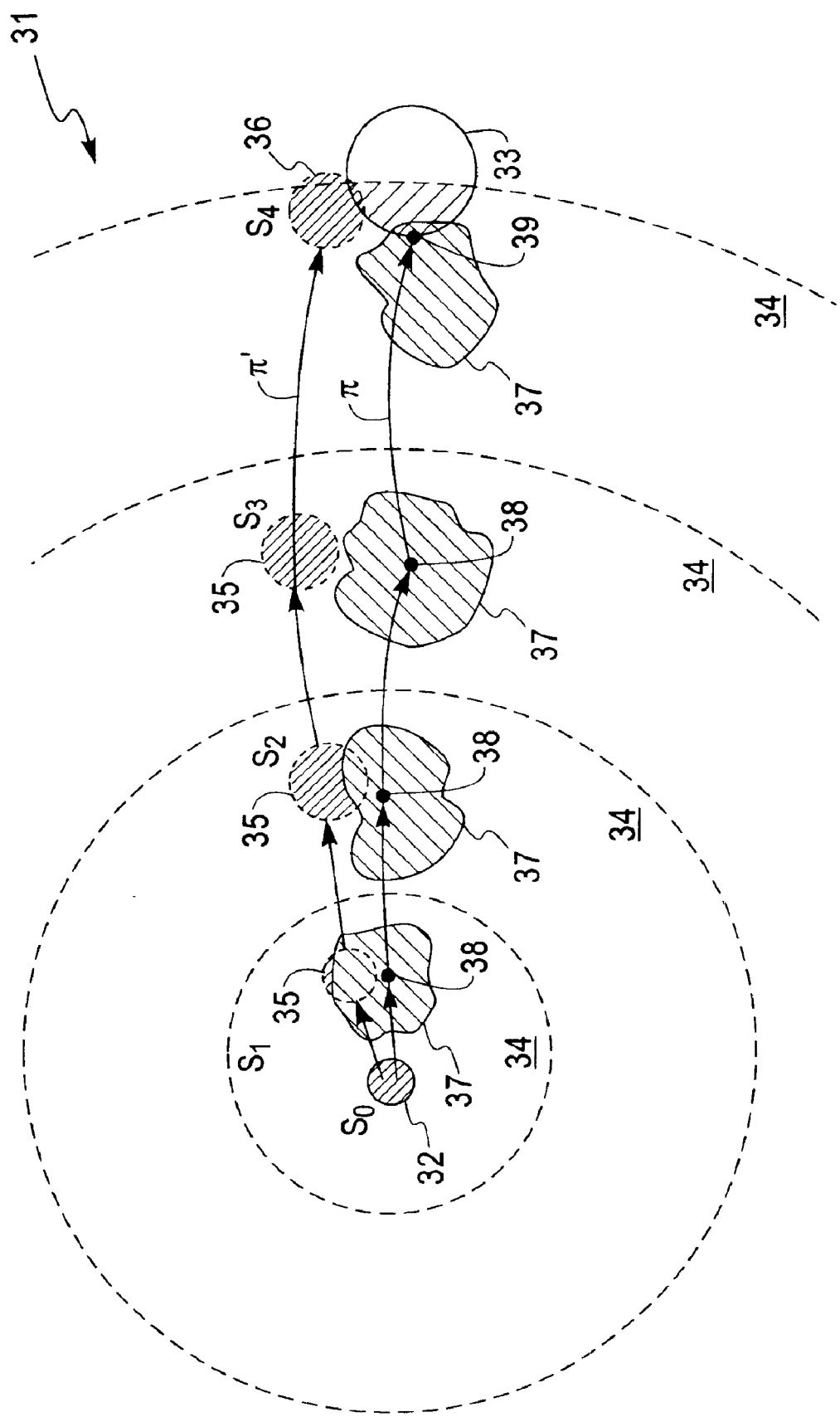
FIG. 2 is a schematic representation of a system state space, illustrating reconstruction of an abstract trace, in accordance with a preferred embodiment of the present invention.

FIG. 2 is a schematic representation of a state space 31 of model 26, providing a conceptual view of the method of the present invention. The method is described in detail below, with reference to FIG. 3. Within state space 31, an abstract model M' is defined with a reduced set of variables. A search for a counterexample begins from a set 32 of initial states, labeled $S_0$, which are typically specified by user 24. At each iteration of the transition relation, processor 22 applies an image operation to the variables in the reduced set in order to map $S_0$ into a set 34 of states $S_1$. Subsequent iterations map each set $S_i$ into a successive set $S_{i+1}$. The purpose of this computation is to determine whether there is a counterexample path Π' through the state space of the abstract model that reaches a set 33 of target states, in which one of the specification formulas is false. In the example shown in FIG. 2, path Π' passes through states 35 in each set of states $S_i$ in the abstract model until the path reaches a target state 36 that intersects with set 33. States 35 of the abstract model are shown conceptually as extended regions in FIG. 2, to indicate that each of these states actually corresponds to a range of states in the complete model. Similarly, path Π' corresponds to multiple possible paths in the complete model.

Preferably, processor 22 uses an on-the-fly method to find a counterexample trace 35 in state space 31. Such methods are described, for example, in "On-the-fly Model Checking of RCTL Formulas," *Proceedings of the Tenth International Conference on Computer Aided Verification* (CAV 1998), which is incorporated here in by reference. As each new set 34 is computed, it is checked against the path specification to determine whether there is a reachable counterexample path through state space 31 that reaches a state in set 33. The computation continues until the path reaches a target state, or until it is determined that no such path exists. Alternatively, the entire transition relation of the abstract model may be computed before searching for a counterexample path. Other methods for computing the transition relation and finding counterexamples may also be used.

After finding path Π', processor 22 attempts to reconstruct a path π through state space 31 of the complete model that corresponds to Π'. The process of reconstruction proceeds iteratively, through a sequence of intermediate models of successively-decreasing abstraction, as described below. To reconstruct the path, the states of the complete model are mapped by the image operation, beginning from set 32, to successive sets 37 of states. Because the abstract model includes fewer variables (and therefore more behaviors) than the complete model, each of sets 37 is a subset of the corresponding set 34 of states of the abstract model, as shown in the figure. To successfully reconstruct path π in the complete model, processor 22 must find at least one state 38 of the complete model that is within the range of each abstract model state 35 on path Π', culminating in a target state 39. In symbolic terms, this means that state 35 must be a projection of at least one state 38 of the complete model, as described in detail hereinbelow. In the example shown in FIG. 2, within set $S_3$ of the abstract model, state 35 is disjoint from set 37. Therefore, reconstruction of path Π' on the complete model fails. The initial abstract model M' is then refined to generate a new abstract model, typically by adding variables from M to reduce the abstraction of M', and the reconstruction process is repeated.

Definitions

Before proceeding to describe the particular methods of localization reduction provided by the present invention, it is useful to define the terms used in the description that follows:

A model M has finite set of variables $V=\{v_1, \ldots, v_n\}$, which are referred to as state variables. Each state variable $v_1$ can be equal to one of a finite set of values $D_1$. Each state 0 in M is defined by a particular value assignment to the variables $\{v_1, \ldots, v_n\}$.

Expressions are built from variables in V, constants from D, and function symbols (typically mathematical or Boolean).

Atomic formulas are constructed from expressions and relation symbols. The set of all atomic formulas is called Atoms (M).

The support of an atomic formula f is the set of state variables that explicitly appear in f. For example, $Support(v_1+1+(v_2/v_5)=12)=\{v_1, v_2, v_5\}$.

As described by Clarke et al. in *Model Checking* (cited above), a model M can be represented as a Kripke structure K=(S,I,R,L), including the following elements:

$S=D_1 \times \ldots \times D_n$ is a set of states $I \subseteq S$ is a set of initial states.

$R \subseteq S \times S$ is a transition relation.

$L:S \to 2^{Atoms(M)}$ is a labeling of the states s in S given by $L(s)=\{f \in Atoms(M)|s|=f\}$.

Based on the Kripke structure, formulas applicable to M can be represented using ACTL temporal logic, which is a fragment of CTL that is particularly useful for symbolic model checking, as described by Clarke et al.

Various methods can be used to abstract model M for purposes of localization reduction. The methods described hereinbelow use projection for this purpose, which is defined as follows:

Definition 1—State Projection:

Given a state $s=(v_1, \ldots, v_n)$ and a subset of the state variables $V' \subseteq V$, let m=V'| and let $i_1, \ldots, i_m$ be the indices in increasing order of the state variables that belong to V'. Then let $v'_1=v_{i_1}, v'_2=V_{i_2}, \ldots, v'_m=v_{i_1}$. The state projection of s on V', denoted proj(s,V') is the m-tuple $S'=(v_1', \ldots, V_m')$ that satisfies $s'=\exists(V/V')s(V)$. In other words, the state s is projected onto the coordinates of the variables contained in V'.

Definition 2—Set Projection:

Given a set of states S and a set of state variables V', the set projection S' of the set S on V' is defined as $S'=\{proj(s, V')|s \in S\}$.

Definition 3—Model Projection:

Given a Kripke structure K representing a model M and a subset of the state variables V', the model projection K' of K with respect to V' (and the corresponding model M') is defined as follows:

$S'=proj (S, V')$ $I'=proj (I, V')$ $R=\{(s'_1, s'_2)|s'_1=proj (s_1, V'), s'_2=proj (s_2, V'), (s_1, s_2) \in R\}$ $L(s)=\{f \in Atoms(M')|s'|=f\}$, wherein Atoms(M') is the subset of Atoms(M) in which only variables belonging to V' appear.

Note that M<M' by the definition of model projection.

Definition 4—Path Projection:

The projection of a path $\pi=\{s_0, s_1, \ldots, s_k\}$ on a set of variables V' is a set of paths $\Pi'=\{S_0', S_1', \ldots, S_k'\}$, wherein for all i, $S_i'=proj(s_i, V')$. For convenience we denote $\Pi_i'=S_i'$. A projection of a path has a set of states as path elements, and therefore corresponds to a set of paths in the complete model.

In the description below of preferred embodiments of the present invention, the terms abstraction and projection are used interchangeably. Although the principles of the present invention are applicable using other methods of abstraction, projection is particularly useful in automated implementation of the methods of symbolic abstraction reduction described herein. When Binary Decision Diagrams (BDDs) are used to represent states of the model, as is the case in many symbolic model checking programs, projections of sets of states can be calculated conveniently by the standard BDD operation of existential quantification. An exemplary implementation of such a projection procedure is given below in Table I.

TABLE I

BDD PROJECTION

```
/* Given a list of variables "a" and a BDD "b" the
/* procedure proj generates a BDD that is a projection
/* of "b" onto the variables in "a".
bdd_ptr proj(var_list a, bdd_ptr b)
{
    bdd_ptr result;
    if(b = = ONE || b = = ZERO) return(b);
    if(a = = ONE) return ONE;
    int alevel = GETLEVEL(a);
    int blevel = GETLEVEL(b);
    if(alevel < blevel)
        result = proj(a->next, b);
    else if(alevel = = blevel)
        result=find_bdd(blevel, proj(a->next, b->left),
            proj(a->next, b->right));
    else
        result = or_bdd(proj(a, b->left), proj(a,
            b->right));
    return(result);
}
```

The transition relation R can be partitioned according to the state variables as $R=\cap R_i$, wherein $R_i \subseteq S_i \times V_i'$. Here $V_i'$ is a projection of S' onto $\{v_i'\}$, and $S_i$ is a projection of S onto some $Supp_i \subseteq V$, wherein $Supp_i$ is the support of variable $v_i$, i.e., the set of state variables that appear in the atomic formulas that describe the next-state behavior of $v_i$. The next value of $v_i$ is independent of the other variables that are outside its support. The support relationships among the state variables can be pictured as a graph, in which each variable is a node, and there is an edge from $v_i$ to $v_j$ if $v_j \in Supp_i$. This sort of partition is particularly apt in modeling hardware implementations and is useful in the layered path reconstruction methods described below.

The Abstraction Refinement Process

Figure 3:
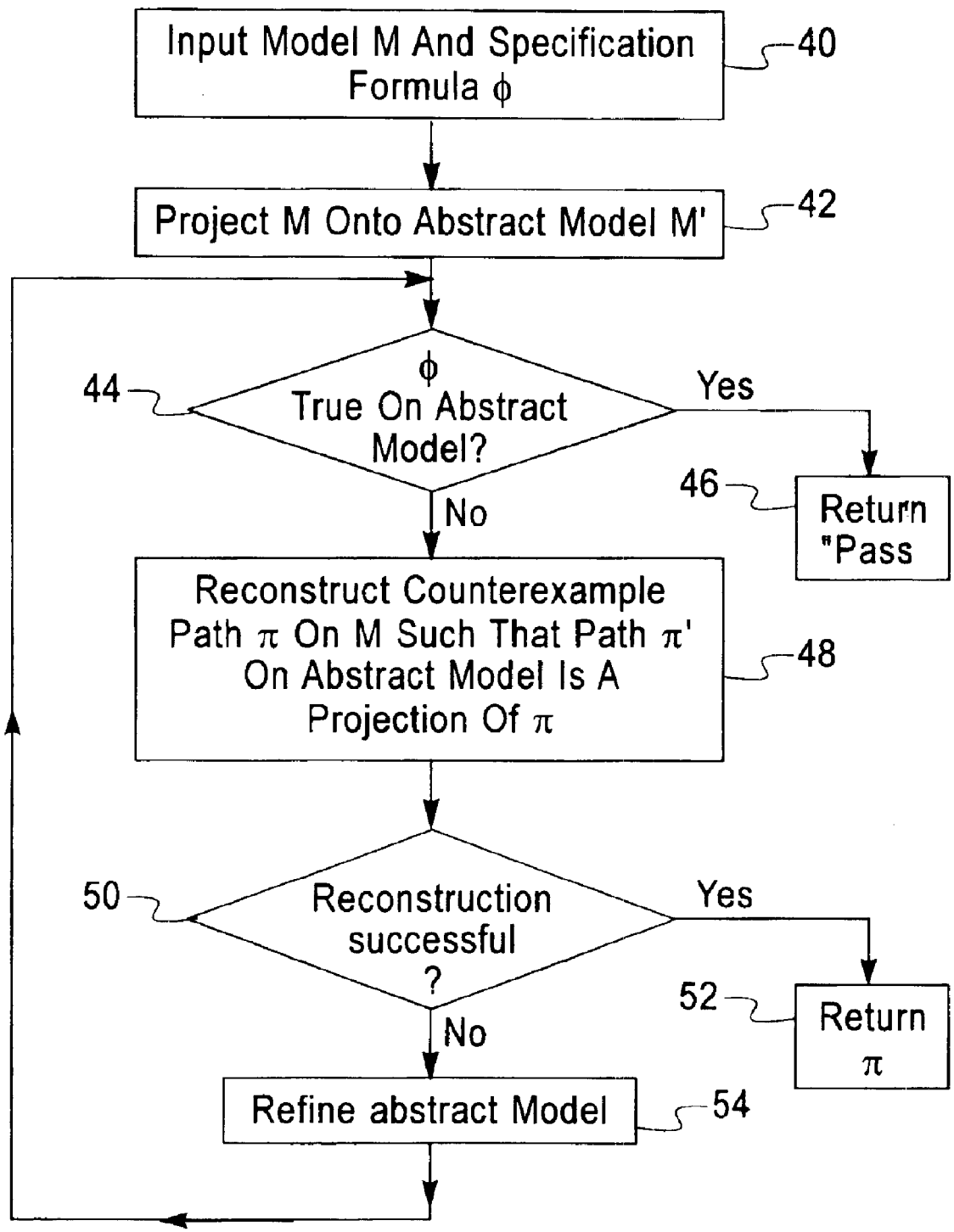
FIG. 3 is a flow chart that schematically illustrates a method for model checking with localization reduction, in accordance with a preferred embodiment of the present invention.

FIG. 3 is a flow chart that schematically illustrates a method for design verification using iterative localization reduction, in accordance with a preferred embodiment of the present invention. As noted above with reference to FIG. 1, the verification process begins when user 24 inputs model 26 and specification properties 28 to processor 22, at an initialization step 40. Processor 22 projects the input model M onto an initial abstract model M', at an initial projection step 42. Preferably, for a given specification property φ under test, the variables in M' are chosen to be those in the support of the atomic formulas of φ.

Processor 22 performs automated model checking on M', as described above with reference to FIG. 2, at a model checking step 44. If no counterexample trace is found on M', it means that the property φ is true on the abstract model, and therefore must be true on M, as well. In this case, processor 22 returns an indication to user 24 that the design model passed this test, at a passing step 46.

On the other hand, if a counterexample trace Π' is found in model M' at step 44, processor 22 attempts to reconstruct a counterexample path π on M, at a reconstruction step 48. Path π is found in such a way that Π' is a projection of π, as defined above. The reconstruction is carried out iteratively, by adding successive layers of variables to create successively less abstract intermediate models M", as described below with reference to FIG. 4. Upon completion of the reconstruction process, processor 22 determines whether a path π can be found on M, at a completion step 50. If so, processor 22 informs user 24 that the design has failed to fulfill property φ, and returns the counterexample trace it has found, at a failure step 52.

If processor 22 is unable to find a path π on M of which trace Π' is a projection, the processor refines the abstract model M', at a refinement step 54. The refinement takes advantage of information collected at step 48. Details of the refinement step are described hereinbelow with reference to FIG. 6. The refined abstract model is then retested at step 44, and the procedure continues as described above until either the model successfully fulfills the property φ at step 44, or a path π on M is found at step 50.

Layered Reconstruction

Figure 4:
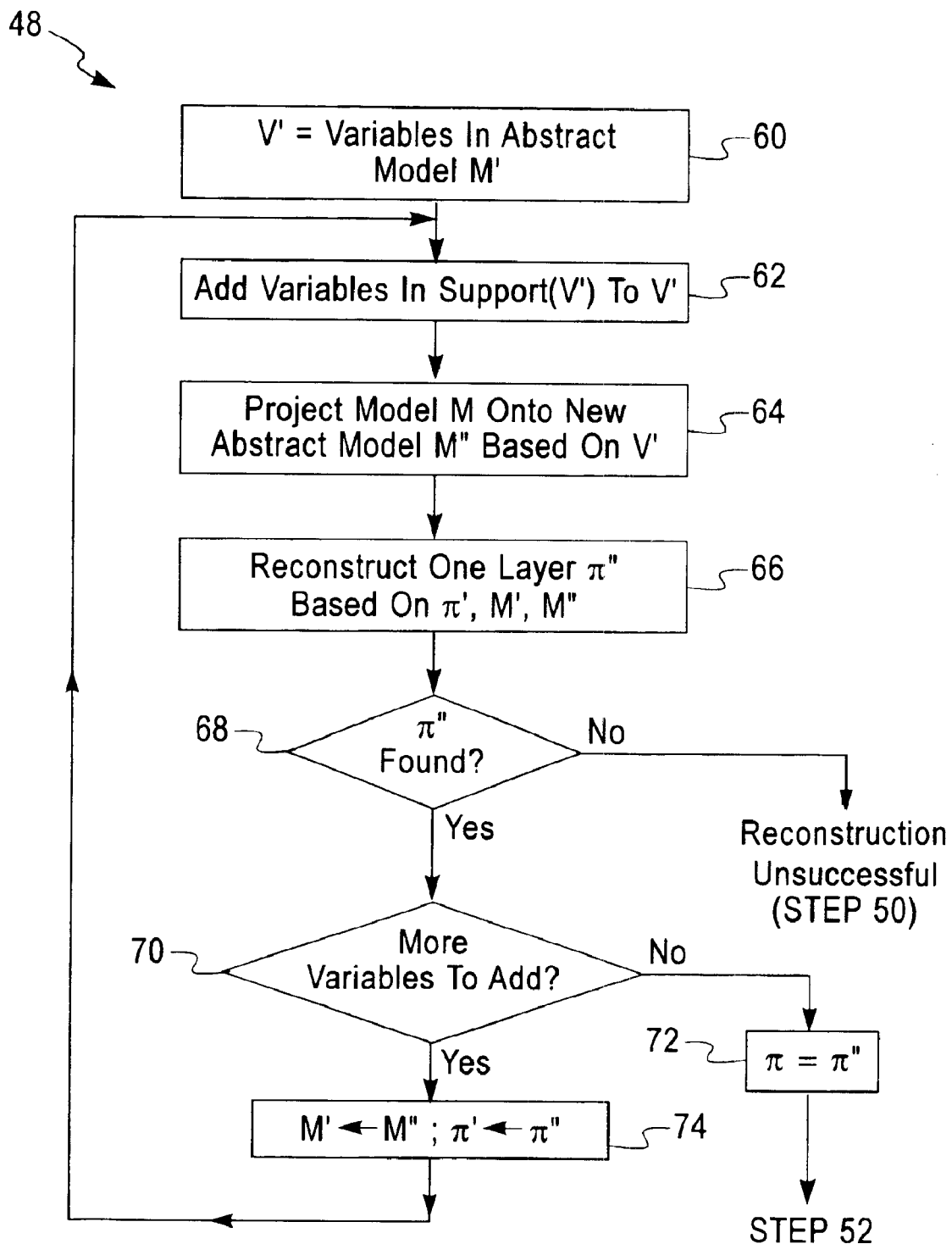
FIG. 4 is a flow chart that schematically illustrates a method for reconstructing a counterexample path, in accordance with a preferred embodiment of the present invention.
Figure 5:
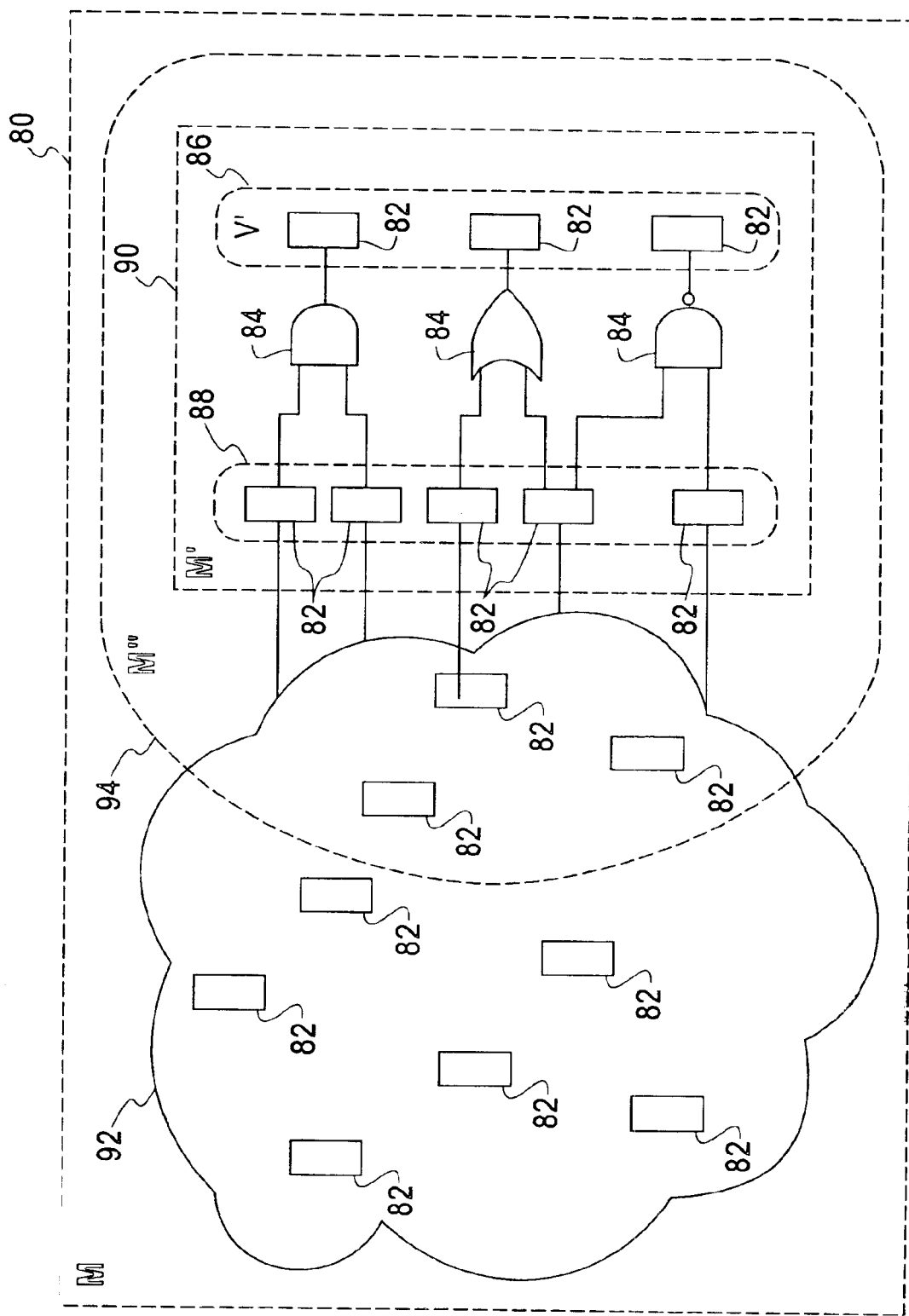
FIG. 5 is a block diagram that schematically illustrates a set of models with varying levels of abstraction, in accordance with a preferred embodiment of the present invention.

Reference is now made to FIGS. 4 and 5, which schematically show details of reconstruction step 48, in accordance with a preferred embodiment of the present invention. FIG. 4 is a flow chart that shows a preferred method for layered path reconstruction. FIG. 5 is a block diagram showing models at different levels of abstraction, useful in understanding the notion of layers as used herein.

To begin the process of path reconstruction, the abstract model M' is given by an initial, reduced set of variables V'={$v_1'$, ..., $v_m'$}, as defined above, at an initial abstraction step 60. Preferably, V' is chosen initially to include the variables that are in the support of the atomic formulas of φ, and M' is obtained by projecting M onto V'. An abstract counterexample trace Π' is found on M', as described above in reference to step 44. A new layer of variables is then added to V', at a layer addition step 62. A new abstract model M", of reduced abstraction, is obtained by projecting M onto the new reduced set of variables V', at a model projection step 64.

Preferably, the new layer added at each iteration through step 62 is disjoint from the preceding layers and contains variables in the support of the existing V'. Formally, a layer of variables $U_i$ is defined as follows, beginning from the initial set V':

1. $U_0$=V' is a layer.
2. Any set $U_i \subseteq$ support $$U_i \subseteq \text{support}\left(\bigcup_{0 \le k \le i-1} U_k\right) \Big/ \bigcup_{0 \le k \le i-1} U_k$$

layer.
Thus, a new layer may contain the entire support of the preceding layer (other than the variables already in the preceding layers), or it may contain a subset of the support. A breadth-first or depth-first approach may be taken to choosing the support variables to add in each layer. Preferably, if a previous reconstruction step failed, and refinement of the model was carried out at step 54, then variables in the support of the variables added in the refinement stage are given priority for addition to the model at step 62.

The notion of layers is shown graphically in FIG. 5. A complete model 80, labeled M, contains a complete set of state variables 82. The atomic formulas of property φ are represented schematically by operators 84, with a set of formula variables 86, identified as the initial V'. The variables in a support 88 of the atomic formulas are added to V' in order to generate a first abstract model 90, labeled M'. Subsequently, variables 82 in a remaining set 92 of the variables in M are successively added to the model in order to create new layers. For example, a subsequent abstract model 94, labeled M", will include variables 82 that are in the support of the variables in support 88. Further layers are added in iterations through step 62, until path π has been completely reconstructed, or until the reconstruction process fails.

Returning to FIG. 4, once the new abstract model M" has been created at step 64, a new abstract path Π" is reconstructed, at a path layer reconstruction step 66. The new abstract path is found by using the new model M" together with the abstract path Π' and the preceding abstract model M' (on which the abstract path Π' was determined). The method used at step 64 depends on the type of path that is to be found, which is determined by the model M and the specification property φ. A number of alternative methods for reconstructing a path layer are described below. In any case, at each pass through step 66, a relatively small number of variables is added to the model before attempting to reconstruct the path on the expanded variable set.

After each pass through step 66, processor 22 assesses whether the new path Π" was successfully reconstructed, at a path assessment step 68. If no new path could be reconstructed, the processor concludes that the reconstruction has failed (step 50), and proceeds to refine the original abstract model (step 54). If Π" was successfully reconstructed, the processor determines whether there are any more new variables to be added to M", at a variable checking step 70. If there are no more such variables left in set 92 (FIG. 5), it means that M"=M, so that a complete path has now been reconstructed. In other words, the processor determines that Π"=π, at a path completion step 72. The processor returns the path π as a counterexample of the specification property at step 52, as described above.

On the other hand, as long as there are more variables remaining to be added to the abstract model, the processor proceeds to reconstruct another layer of the path. For this purpose, it substitutes the new model M" for M', and the new abstract path Π" for Π', at a substitution step 74, and then proceeds to iterate through the method again, starting from step 62.

For the sake of completeness, Table II below provides a pseudocode representation of the method shown in FIG. 4.

TABLE II

LAYERED RECONSTRUCTION reconstruct (Π', M', M"){
    $Π^0$ = Π';
    i = 1;
    U := variables_of(M');

TABLE II-continued

LAYERED RECONSTRUCTION

```
    while    ( (U ≠ Ø) ∧ ( Π^i ≠ Ø) ){

U := choose_n_variables(support(U)/U) ∪ U;
        M" := project_model(M, U);
        Π^{i+1} := reconstruct_one_layer(Π^i, M', M");
        if (Π^{i+1}=Ø) return Ø; /*refinement needed*/
        i = i +1;
    }
    return choose_one_counter_example(Π^i);
}
```

The function "reconstruct_one_layer" in Table II corresponds to step 66 in the method of FIG. 4. Various different implementations of this step are possible, as shown in pseudocode form in Tables III, IV and V, below. The choice of implementation depends on whether or not the counter-example path that is sought includes a loop or not. As is known in the model checking art, counterexample traces for safety properties (such as AG properties, in temporal logic notation) do not contain loops. On the other hand, a counterexample trace for a liveness property (such as an AF property) must contain a loop. Tables III an IV show two methods of reconstruction for paths without a loop, while Table V shows a method for looped paths. These particular heuristic methods for layered reconstruction are brought here by way of example. Alternative methods will be apparent to those skilled in the art and are considered to be within the scope of the present invention.

TABLE III

RECONSTRUCTION WITHOUT A LOOP - METHOD 1

```
reconstruct_one_layer_no_loop1(Π', M', M"){
    last = |Π'|-1;
    s := S_0;
    i := 0;
    V' := variables_of(M');
    while (i < last){
        next_s := S_{i+1};
        new :=image(s, M") ∩ next_s
        if(new = Ø){
            /*try to see if the selection of values in
            /* V"/V' can be changed */
            suspect := preimage(proj(next_s,V'),M');
            if ((suspect ∩ s) ≠ Ø{
                /*check whether S_{i+1} can be replaced*/
                new := image(s,M")∩ proj(next_s,V');
                if(new = Ø)
                    return Ø;/*refinement needed*/
                else /*replace S_{i+1}*/
                    S_{i+1} := new;
            }
            else
                return Ø;/*refinement needed*/
        }
        i := i+1;
        s := new;
    }
    return Π";
}
```

In the listing above, $\Pi' = \{S_0, S_1, \ldots, S_{last}\}$, and the functions image and preimage correspond to forward and reverse operations of the system transition relation, as described above. The method of Table III iteratively performs forward image steps on the abstract model M", beginning from the initial states I", and conjuncts the result of each step with the corresponding step in π'. If the conjunction reaches a dead end (new=Ø), the method returns to the preceding step and attempts to modify Π' to be consistent with M". The method of Table III succeeds when the reconstruction reaches the target state $S_{last}$, and fails if for some $S_i$ on Π', no corresponding state can be found in M".

The choice of a specific Π' is arbitrary, and the variables in the states of Π' can take any values that are consistent with M'. Referring to FIG. 5, for example, variables 82 in support 88 of V' that were added to create model 90 (M') are "cut free" of their behavioral dependence on the remaining variables in set 92. Therefore, these "free" variables behave non-deterministically in M', and their values can be changed freely in order to make them consistent with M". This change is performed in the method of Table III by projecting the inconsistent state (next_s) onto V' and preimaging the projected state to preserve only the desired values in V'. The preimage operation is preferably performed on M', rather than the larger state space of M", in order to avoid state explosion. The method of Table III then attempts to find other values for the variables V" that are in M" but not M' (i.e., V"/V') that will make the next state consistent with the model.

Layered reconstruction according to the method above gives good results in relatively simple cases, but in larger state spaces it may lead to explosion, since the number of counterexamples to be searched in the abstract model grows at each iteration. It is sufficient, of course, to find a single counterexample in the abstract model that is a projection of a complete counterexample. Therefore, in an alternative approach, shown below in Table IV, the abstract counterexamples are under-approximated, in the expectation that the under-approximated set will still contain a valid counterexample. This expectation may be frustrated, in that the under-approximation may preserve invalid abstract counterexamples, which will turn out not to be projections of complete counterexamples, while discarding the valid counterexamples. Therefore, in the method of Table IV, when the layered reconstruction process reaches a dead end, it backtracks through previous steps by preimage computations, until it finds a new abstract counterexample that may be valid.

TABLE IV

RECONSTRUCTION WITHOUT A LOOP - METHOD 2

```
reconstruct_one_layer_no_loop2(Π', M', M"){
    last = |Π'|-1;
    for (i : =0 to last -1) S_i^{all} = Ø;
    i := 0;
    V' := variables_of (M');
    S_0 := I" ∩proj(S_0, V');
    while (i ≥ 0 and i < last){
        prev := proj(S_i, V');
        new := proj(S_{i+1}, V');
        step := preimage(new, M");
        if (step∩S_i ≠ Ø) /*step forward */{
            S_{i+1} = image(step, M")∩S_{i+1};
            S_{i+1} = subset(S_{i+1});
            i = i + 1;
        }
        else if (step∩prev ≠ Ø) /*backtracking*/{
            S_i = preimage(S_{i+1}, M")∩prev/S_i^{all};
            if (S_i = Ø) return Ø;
            S_i = subset(S_i);
            S_i^{all} = S_i^{all} ∪ S_i;
            i = i - 1;
        }
        else return Ø; /*refinement is needed */
    }
}
```

TABLE IV-continued

RECONSTRUCTION WITHOUT A LOOP - METHOD 2

```
        return Π";
}
```

Under-approximation is implemented in the method of Table IV by means of a subsetting function, as is known in the model checking art. Subsetting is described, for example, by Ravi et al., in "High-Density Reachability Analysis," *International Conference on Computer Aided Design* (*ICCAD* 1995, San Jose, Calif.), pages 154–158, which is incorporated herein by reference. This technique extracts a small, dense subset of the set of states represented by a given BDD, so that the BDD of the subset is small. The size of the subsetted BDD is set heuristically, so as to prevent state explosion on the one hand, while avoiding excessive backtracking on the other. The inventors have found subsetting to a reduced BDD size of 5000 nodes to be useful in model checking of hardware designs. Other methods of under-approximation may similarly be used.

The method of Table IV performs forward and backward (image and preimage) steps for as long as possible. The forward steps proceed as long as the next step of the path is consistent with the model M", continuing either until the entire trace Π" is reconstructed or until the next forward step does not intersect the next state on the abstract path Π'. In the latter case, the method backtracks to find different behavior for V"/V' that will make the next forward step possible. The backtracking continues until forward steps are again possible, or until no further backward steps can be taken. In the latter case, the reconstruction fails.

To reconstruct an abstract path with a loop, the corresponding concrete path must contain a loop, as well. A naïve, trial-and-error method for finding looped paths is effective in many cases.

The method of Table V below provides a more systematic, fixed point approach to reconstructing a loop in an abstract path. (A fixed point algorithm computes a transformation on a set over and over until no change is seen.) In this method, the input path Π' in the abstract model M' is assumed to be a looped path, without the "tail" from the initial state of the model to the beginning of the loop. Since a concrete path may loop several times in one loop of a corresponding abstract path loop, the present method reconstructs a path whose length is a multiple of the length of the abstract path loop, |Π'|−1.

TABLE V

RECONSTRUCTION WITH A LOOP

```
reconstruct_a_loop(Π', M', M"){
    old := TRUE;
    new := S_0;
    last := |Π'|−1;
    Π=∅;
    while ((new∩old ≠ ∅) ∤ (new ≠ old)){
        i := 1;
        new := new∩old;
        old := new;
        step := new;
        append(step, Π);
        while (i ≤ last)}
            step := image(step, M")∩S_i;
            if (step = ∅)
                refine;
            else {
```

TABLE V-continued

RECONSTRUCTION WITH A LOOP

```
                append(step, Π);
                S_i := step;
                i := i + 1;
            }
            new := step;
        }
    }
    if (new∩old ≠ ∅){
        S_0 := new;
        return extract_loop_trace(Π, M");
    }
    else
        refine;
}
```

The method of Table V is invoked when the abstract path Π' is known to contain a loop. As noted above, the path typically also has a prefix that leads from an initial state to some state in the loop. The prefix is reconstructed by the method of Table III or IV, while the loop part of the path is reconstructed as detailed in Table V. Thus the procedure reconstruct_a_loop receives a path Π' that contains only the loop part of the path. In Table V, assigning TRUE to the variable old symbolically means that the entire state space S is initially included. At each iteration, the fixed point algorithm removes states from old (the first abstract state in the loop, which corresponds to a set of concrete states). The method terminates when it reaches an iteration in which old does not change. Note that each iteration contains an inner loop of length |Π'|−1, so that the final concrete loop is a multiple of this length. If the fixed point is the empty set, then there is no loop in the path.

In the fixed point method of Table V, upon termination of the fixed point (new=old), if new is non-empty, then a concrete loop exists corresponding to the abstract loop. It is possible, however, that not all states in $S_0$, the abstract set of states at the start of the loop, are actually on the loop. Therefore, the routine extract_loop_trace chooses one of the states from $S_0$ and iteratively performs backward (preimage) steps from the chosen state until some state in $S_0$ is encountered more than once.

Refinement of the Abstract Model

Figure 6:
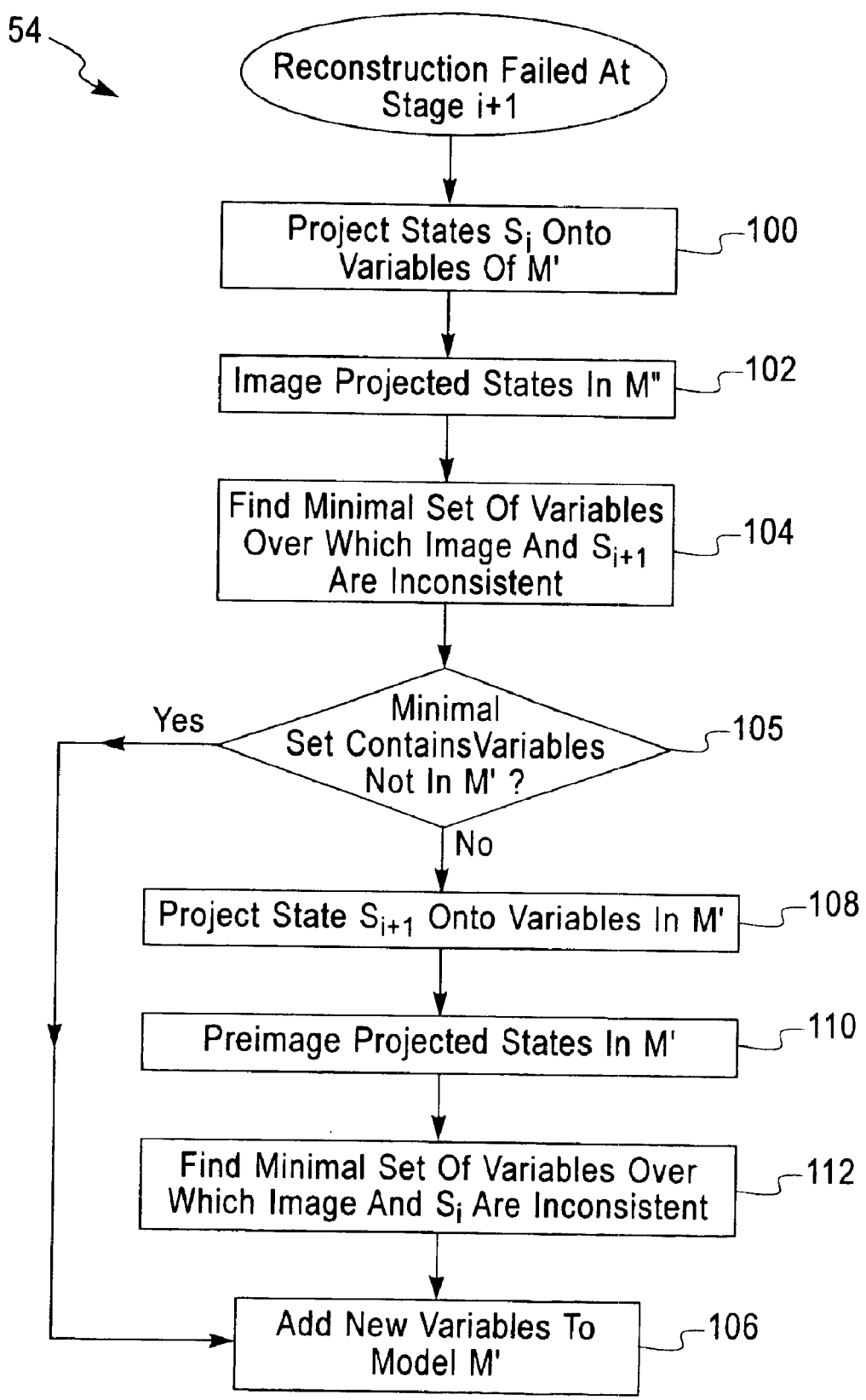
FIG. 6 is a flow chart that schematically illustrates a method for refining an abstract model, in accordance with a preferred embodiment of the present invention.

FIG. 6 is a flow chart that schematically shows details of refinement step 54, in accordance with a preferred embodiment of the present invention. As noted above, processor 22 undertakes step 54 when it determines that it is not possible to reconstruct a path π based on the abstract path Π' that was found in the initial abstract model M' at step 44. The method of FIG. 6 then refines the initial model by identifying a small set of the variables in V"/V' for which values could not be found that would have allowed a complete path π to be reconstructed from Π'. This method takes as its point of departure that the layered reconstruction method at step 66 (FIG. 4) succeeded in reconstructing path $\Pi^{j+1}$ in model M" up to some state $S_i$ on $\Pi^j$, but then was not able to reconstruct the path to the next state $S_{i+1}$. Thus, the method of FIG. 6 relates to particular models M' and M" (with their corresponding variables V' and V") and particular sets of states $S_i$ and $S_{i+1}$ in M'.

The states in $S_i$ are projected onto the set of variables V', at a projection step 100. The transition relation of M is then used to image the projected set of states in M", at an imaging step 102. Processor 22 finds inconsistencies between the values of the variables in V"/V' in the projected states in M"

and the values of the same variables in $S_{i+1}$, at a difference finding step 104. The processor uses a heuristic algorithm to find a minimal set of the inconsistent-valued variables. It then checks these variables to ascertain whether these variables already exist in the abstract model M', at a variable checking step 105. Any of the variables in this minimal set that are not already in M' are added to M', at a model localization step 106. This refined model is then used in the next stage of abstract path analysis and reconstruction.

Alternatively, if at step 105 the processor determines that there are no variables in the minimal set that are not already in M', it goes on to project the next set of states $S_{i+1}$, onto the variables V' in M', at a new projection step 108. These projected states are preimaged back to the preceding set of states, at a preimaging step 110. In this case, processor 22 finds inconsistencies between the values of the variables in the preimaged states in M" and the values of the same variables in S, at a new difference finding step 112, again using a heuristic algorithm to find a minimal set of the inconsistent-valued variables. The variables in this minimal set that are not already in M' are then added to M' at step 106, for use in the next stage of abstract path analysis and reconstruction.

Table VI below presents the method of FIG. 6 in pseudocode form:

TABLE VI

REFINEMENT

```
refine(S_i, S_{i+1}, M', M"){
    V' := variables_of(M');
    prev := proj(S_i,V');
    D := differ(image(prev, M"), S_{i+1});
    if (D ⊆V'){
        new := proj(S_{i+1}, V');
        D := differ(preimage(new, M"), S_i);
    }
    return add_to_model(M',D);
}
```

The method shown in the table uses a heuristic function differ(A,B) to find the minimal set of inconsistent-valued variables (step 104 in FIG. 6). The function differ takes two sets of states A and B, A∩B=∅, which are preferably represented as BDDs, and finds a set of variables P such that proj(A,P) ∩ proj (B,P)=∅. The function begins its operation in the method above by setting P=V". It randomly eliminates variables from V"/V' in P until proj (A,P) ∩ proj (B,P)≠∅. Then, by backtracking one step in the process of variable elimination, a minimal set of difference variables is found. Preferably, processor 22 attempts eliminating the variables in a number of different-ordered sequences, and then chooses the sequence that gives the smallest set of variables to add at step 106.

Experimental Results

The inventors have tested the methods of layered reconstruction described above on a number of actual hardware models. They compared the results with those obtained by model checking without localization, and by non-layered localization using the method of Clarke et al., as described in the Background of the Invention. For safety properties, in those cases in which the model passed the property, the localization methods of the present invention generally succeeded in verifying the property in considerably less time and with lower expenditure of computer memory than Clarke's localization method or methods without localization. The reason for this improvement is evidently that the present invention generally allows safety properties to be verified on a much smaller model than prior art methods. There were a number of models on which the computer performing the model checking using Clarke's method or a non-localization method ran out of memory before completing the verification process. The methods of the present invention generally succeeded in handling these cases, with dramatic performance improvements in some instances.

When the model under test failed a given safety property, the results obtained by the methods of the present invention were comparable to those of model checking methods without localization. Evidently, when a property fails, a greater number of iterations are typically required through the reconstruction/refinement method of FIG. 3, so that the advantage of localization is less marked.

In testing liveness properties, the methods of the present invention were found in some cases to be substantially faster and to use much less memory than non-localization methods. Both the fixed-point method of Table V and the "naïve" method for reconstructing looped paths, as described above, were found to give good results. The advantage of the methods of the present invention over non-localization methods was less marked in testing of liveness properties than safety properties.

Although the preferred embodiments described above make use of symbolic model checking tools and state representations, the principles of the present invention may similarly be applied, mutatis mutandis, to other methods of formal verification, such as ATPG and SAT solving. For example, Wang et al. describe the use of abstraction refinement in trace reconstruction using an ATPG solver in "Formal Property Verification by Abstraction Refinement with Formal, Simulation and Hybrid Engines," 38*th IEEE Design Automation Conference* (DAC 2001, Las Vegas, Nev.), pages 35–40. The use of abstraction refinement in SAT solving is described by Clarke et al., in "SAT Based Abstraction-Refinement Using ILP and Machine Learning Techniques," *Proceedings of the Sixteenth International Conference on Computer-Aided Verification* (CAV 2002, Copenhagen); and by Chauhan et al., in "Automated Abstraction Refinement for Model Checking Large State Spaces using SAT based Conflict Analysis," *Formal Methods in Computer Aided Design* (FMCAD 2002). These publications are incorporated herein by reference. Adaptation of the methods described hereinabove to such ATPG- and SAT-based techniques will be apparent to those skilled in the art and is considered to be within the scope of the present invention.

It will thus be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. A method for verifying a property of a complete model of a system under study, the model defining states of the system based on a set of state variables and a transition relation among the states, the method comprising:

abstracting at least some of the variables from the model so as to produce an abstract model of the system;

beginning with an initial state in a state space of the abstract model, iteratively applying an image operation, moving forward through the state space in accordance with the transition relation, to the variables remaining in the abstract model so as to find an abstract path through the state space of the abstract model to a target state defined by the property;

restoring a subset of the abstracted variables to the abstract model so as to produce an intermediate model of the system; and verifying the property on the complete model based on the intermediate model.

2. A method according to claim 1, wherein verifying the property comprises determining that the complete model satisfies the property when the abstract model satisfies the property.

3. A method according to claim 1, wherein verifying the property comprises performing a partial reconstruction of the abstract path on the intermediate model, and verifying the property based on the partial reconstruction.

4. A method according to claim 3, wherein verifying the property further comprises reconstructing a complete path through the state space of the complete model based on the intermediate path.

5. A method according to claim 4, wherein reconstructing the complete path comprises repeating the steps of restoring the subset of the abstracted variables and performing the partial reconstruction in order to generate a sequence of intermediate models, with respective intermediate paths reconstructed on the intermediate models, until the complete path has been reconstructed.

6. A method according to claim 3, wherein performing the partial reconstruction comprises identifying a point of failure in reconstructing the abstract path on the intermediate model, and modifying the abstract path responsively to the point of failure, and performing the partial reconstruction based on the modified abstract path.

7. A method according to claim 3, wherein performing the partial reconstruction comprises identifying a point of failure in reconstructing the abstract path on the intermediate model, and refining the abstract model responsively to the point of failure, and repeating the steps of finding the abstract path, restoring the subset of the abstracted variables, and performing the partial reconstruction based on the refined abstract model.

8. A method according to claim 7, wherein identifying the point of failure comprises identifying one or more of the variables having values in the intermediate model that are inconsistent with the reconstruction of the abstract path on the intermediate model, and wherein refining the abstract model comprises adding the identified variables to the abstract model.

9. A method according to claim 8, wherein adding the identified variables comprises providing a first binary decision diagram (BDD) to represent legal states of the intermediate model, and providing a second BDD to represent a spurious abstract model state, and finding a difference between the first and second BDDs.

10. A method according to claim 3, wherein performing the partial reconstruction comprises reconstructing an intermediate path on the intermediate model, such that the abstract path is a projection of the intermediate path on the variables of the abstract model.

11. A method according to claim 1, wherein restoring the subset of the abstracted variables comprises adding a layer of the abstracted variables, such that the variables in the added layer are in a support of the variables in the abstract model.

12. A method according to claim 11, wherein verifying the property comprises performing a partial reconstruction of the abstract path on the intermediate model, while adjusting one or more values of the variables in the added layer abstract path so that the partial reconstruction of the abstract path is consistent with the intermediate model.

13. A method according to claim 12, wherein adjusting the one or more values of the variables in the added layer abstract path comprises at least one of adjusting the values of the variables in a first abstract state on the abstract path that is inconsistent with the intermediate model and adjusting the values of the variables in a second abstract state preceding the first abstract state on the abstract path.

14. A method according to claim 11, wherein adding the layer of the abstracted variables comprises adding the layer in a first intermediate model, and wherein verifying the property comprises performing a partial reconstruction of the abstract path on the first intermediate model, and comprising repeating the steps of restoring the subset of the abstracted variables and performing the partial reconstruction so as to generate a sequence of intermediate models, beginning with the first intermediate model, such that for all the intermediate models following the first intermediate model, restoring the subset of the abstract variables comprises adding a further layer of the abstracted variables, wherein the variables in the added layer are in a support of the variables in a preceding one of the intermediate models in the sequence.

15. A method according to claim 14, wherein repeating the step of performing the partial reconstruction comprises reconstructing respective intermediate paths on all of the intermediate models, so that for all of the intermediate models, the respective intermediate paths are projections of the intermediate paths reconstructed on the intermediate models that are later in the sequence.

16. A method according to claim 15, wherein adding the further layer of the abstracted variables comprises selecting a subset of the variables in the support of the variables in the preceding one of the intermediate models.

17. A method according to claim 16, wherein performing the partial reconstruction comprises:

finding a first set of intermediate model states that are equivalent to a first abstract state on the abstract path;

taking a partial set of candidates from the first set;

finding a second set of the intermediate model states that can be reached by one intermediate model transition from the partial set and are equivalent to a second abstract state on the abstract path;

iteratively repeating the steps of taking the partial set and finding a further set of the intermediate model states that can be reached by one intermediate model transition from the partial set so as to find succeeding abstract states in an order according to which the abstract states appear on the abstract path;

upon determining at an iteration of the step of finding the further set that there are no equivalent intermediate model states that can reached by one transition from the set of intermediate candidates computed in a previous iteration, backtracking to the previous iteration and selecting a different partial set of the intermediate model states; and continuing to repeat the steps of taking the partial set and finding the further set and of backtracking to the previous iteration when there are no equivalent intermediate model states that can reached by one transition, until the abstract path is completely reconstructed or until backtracking all the way to the first set of intermediate model states and concluding that the abstract path cannot be reconstructed, thereby concluding that the abstract model requires refinement.

18. A method according to claim 1, wherein finding the abstract path comprises finding a looped abstract path, and wherein verifying the property comprises reconstructing an intermediate path on the intermediate model, such that the intermediate path includes a loop, and the abstract path is a projection of the intermediate path onto the abstract model.

19. A method according to claim 18, wherein the looped abstract path has a given abstract path length, and wherein reconstructing the intermediate path comprises searching for the intermediate path subject to a condition that the intermediate path have an intermediate path length that is a multiple of the abstract path length.

20. A method for checking a complete model of a system under study, the model defining states of the system in a state space based on a set of state variables and a transition relation among the states, the method comprising:
   abstracting at least some of the variables from the model so as to produce an abstract model of the system;
   beginning with an initial state in the state space of the abstract model, iteratively applying an image operation, moving forward through the state space in accordance with the transition relation, to the variables remaining in the abstract model so as to find an abstract path through the state space of the abstract model to a target state;
   restoring a subset of the abstracted variables to the abstract model so as to produce an intermediate model of the system;
   reconstructing the abstract path on the state space of the intermediate model so as to generate an intermediate path through the state space; and
   reconstructing the intermediate path on the state space of the complete model so as to generate a complete path.

21. A method according to claim 20, wherein reconstructing the intermediate path comprises repeatedly restoring respective subsets of the abstracted variables in order to generate a sequence of intermediate models, and reconstructing respective intermediate paths on the intermediate models in the sequence, until the complete path has been generated.

22. Apparatus for verifying a property of a complete model of a system under study, the model defining states of the system based on a set of state variables and a transition relation among the states, the apparatus comprising a verification processor, which is arranged to abstract at least some of the variables from the model so as to produce an abstract model of the system and, beginning with an initial state in a state space of the abstract model, to iteratively apply an image operation, moving forward through the state space in accordance with the transition relation, to the variables remaining in the abstract model so as to find an abstract path through the state space of the abstract model to a target state defined by the property,
   the processor being further arranged to restore a subset of the abstracted variables to the abstract model so as to produce an intermediate model of the system, and to verify the property on the complete model based on the intermediate model.

23. Apparatus according to claim 22, wherein the processor is arranged to determine that the complete model satisfies the property when the abstract model satisfies the property.

24. Apparatus according to claim 22, wherein the processor is arranged to perform a partial reconstruction of the abstract path on the intermediate model, and to verify the property based on the partial reconstruction.

25. Apparatus according to claim 24, wherein the processor is arranged to reconstruct a complete path through the state space of the complete model based on the intermediate path.

26. Apparatus according to claim 25, wherein to reconstruct the complete path, the processor is adapted to repeatedly restore successive subsets of the abstracted variables and perform successive partial reconstructions, in order to generate a sequence of intermediate models with respective intermediate paths reconstructed on the intermediate models, until the complete path has been reconstructed.

27. Apparatus according to claim 24, wherein the processor is arranged to identify a point of failure in reconstructing the abstract path on the intermediate model, and then to modify the abstract path responsively to the point of failure and perform the partial reconstruction based on the modified abstract path.

28. Apparatus according to claim 24, wherein the processor is arranged to identify a point of failure in reconstructing the abstract path on the intermediate model, and to refine the abstract model responsively to the point of failure, and then to repeat finding the abstract path, restoring the subset of the abstracted variables, and performing the partial reconstruction based on the refined abstract model.

29. Apparatus according to claim 28, wherein the processor is arranged to identify one or more of the variables having values in the intermediate model that are inconsistent with the reconstruction of the abstract path on the intermediate model, and to refine the abstract model by adding the identified variables to the abstract model.

30. Apparatus according to claim 24, wherein in performing the partial reconstruction, the processor is arranged to reconstruct an intermediate path on the intermediate model, such that the abstract path is a projection of the intermediate path on the variables of the abstract model.

31. Apparatus according to claim 22, wherein the processor is arranged to restore the subset of the abstracted variables by adding a layer of the abstracted variables, such that the variables in the added layer are in a support of the variables in the abstract model.

32. Apparatus according to claim 22, wherein the processor is arranged to perform a partial reconstruction of the abstract path on the intermediate model, while adjusting one or more values of the variables in the added layer so that the reconstruction of the abstract path is consistent with the intermediate model.

33. Apparatus according to claim 32, wherein the processor is arranged to add the layer of the abstracted variables in a first intermediate model and to perform a partial reconstruction of the abstract path on the first intermediate model, and then to repeatedly restore the subset of the abstracted variables and perform the partial reconstruction so as to generate a sequence of intermediate models, beginning with the first intermediate model, such that a further layer of the abstracted variables is added to all the intermediate models following the first intermediate model, wherein that the variables in the added layer are in a support of the variables in a preceding one of the intermediate models in the sequence.

34. Apparatus according to claim 33, wherein the processor is arranged to reconstruct respective intermediate paths on all of the intermediate models, so that for all of the intermediate models, the respective intermediate paths are projections of the intermediate paths reconstructed on the intermediate models that are later in the sequence.

35. Apparatus according to claim 22, wherein the processor is arranged to find a looped abstract path, and to reconstruct an intermediate path on the intermediate model such that the intermediate path includes a loop, and the abstract path is a projection of the intermediate path onto the abstract model.

36. Apparatus according to claim 35, wherein the looped abstract path has a given abstract path length, and wherein the processor is arranged to search for the intermediate path subject to a condition that the intermediate path have an intermediate path length that is a multiple of the abstract path length.

37. Apparatus for checking a complete model of a system under study, the model defining states of the system in a state space based on a set of state variables and a transition relation among the states, the apparatus comprising a model processor which is arranged to abstract at least some of the variables from the model so as to produce an abstract model of the system and, beginning with an initial state in the state space of the abstract model, to iteratively apply an image operation, moving forward through the state space in accordance with the transition relation, to the variables remaining in the abstract model so as to find an abstract path through the state space of the abstract model to a target state, the processor being further arranged to restore a subset of the abstracted variables to the abstract model so as to produce an intermediate model of the system, to reconstruct the abstract path on the state space of the intermediate model so as to generate an intermediate path through the state space, and to reconstruct the intermediate path on the state space of the complete model so as to generate a complete path.

38. Apparatus according to claim 37, wherein the processor is arranged to repeatedly restore respective subsets of the abstracted variables in order to generate a sequence of intermediate models, and to repeatedly reconstruct respective intermediate paths on the intermediate models in the sequence, until the complete path has been generated.

39. A computer software product for verifying a property of a complete model of a system under study, the model defining states of the system based on a set of state variables and a transition relation among the states, the product comprising a computer-readable medium, in which program instructions are stored, which instructions, when read by a computer, cause the computer to abstract at least some of the variables from the model so as to produce an abstract model of the system and, beginning with an initial state in a state space of the abstract model, to iteratively apply an image operation, moving forward through the state space in accordance with the transition relation, to the variables remaining in the abstract model so as to find an abstract path through the state space of the abstract model to a target state defined by the property, the instructions further causing the computer to restore a subset of the abstracted variables to the abstract model so as to produce an intermediate model of the system, and to verify the property on the complete model based on the intermediate model.

40. A computer software product for checking a complete model of a system under study, the model defining states of the system in a state space based on a set of state variables and a transition relation among the states, the product comprising a computer-readable medium, in which program instructions are stored, which instructions, when read by a computer, cause the computer to abstract at least some of the variables from the model so as to produce an abstract model of the system and, beginning with an initial state in the state space of the abstract model, to iteratively apply an image operation, moving forward through the state space in accordance with the transition relation, to the variables remaining in the abstract model so as to find an abstract path through the state space of the abstract model to a target state, the instructions further causing the computer to restore a subset of the abstracted variables to the abstract model so as to produce an intermediate model of the system, to reconstruct the abstract path on the state space of the intermediate model so as to generate an intermediate path through the state space, and to reconstruct the intermediate path on the state space of the complete model so as to generate a complete path.

* * * * *